United States Patent [19]

den Boer et al.

[11] Patent Number: 4,698,627

[45] Date of Patent: * Oct. 6, 1987

[54] PROGRAMMABLE SEMICONDUCTOR SWITCH FOR A LIGHT INFLUENCING DISPLAY AND METHOD FOR MAKING SAME

[75] Inventors: Willem den Boer, Troy; J. Scott Payson, Pleasant Ridge; Zvi Yaniv, Southfield, all of Mich.

[73] Assignee: Energy Conversion Devices, Inc., Troy, Mich.

[*] Notice: The portion of the term of this patent subsequent to May 19, 2004 has been disclaimed.

[21] Appl. No.: 679,770

[22] Filed: Dec. 10, 1984

Related U.S. Application Data

[63] Continuation-in-part of Ser. No. 603,852, Apr. 25, 1984, Pat. No. 4,667,189.

[51] Int. Cl.$^4$ .................................................. G09G 3/34
[52] U.S. Cl. .................................. 340/718; 340/719; 340/784; 340/811
[58] Field of Search ............... 340/718, 719, 752, 784, 340/811, 813

[56] References Cited

U.S. PATENT DOCUMENTS

| | | |
|---|---|---|
| 4,103,297 | 7/1978 | McGreivy et al. .................. 340/719 |
| 4,223,308 | 9/1980 | Baraff et al. . | |
| 4,233,603 | 11/1980 | Castleberry ........................ 340/718 |
| 4,239,346 | 12/1980 | Lloyd .................................. 340/719 |
| 4,251,136 | 2/1981 | Miner et al. . | |
| 4,385,292 | 5/1983 | Nonomura et al. ................. 340/719 |
| 4,403,217 | 9/1983 | Becker et al. ...................... 340/718 |
| 4,525,709 | 6/1985 | Hareny et al. ...................... 340/718 |
| 4,535,327 | 8/1985 | Hareny et al. ...................... 340/719 |

FOREIGN PATENT DOCUMENTS 2050031 12/1980 United Kingdom .
2091468 7/1982 United Kingdom .

OTHER PUBLICATIONS

S. Morozumi, et al., "A 250×240 Element LCD Addressed by Lateral MIM", *Japan Display*, 1983, pp. 404–407.

*Primary Examiner*—Gerald L. Brigance
*Attorney, Agent, or Firm*—Marvin S. Siskind; Richard M. Goldman

[57] ABSTRACT

A method of forming a pixel for a liquid crystal display includes forming a pixel electrode on a substrate, depositing a continuous three layer amorphous silicon alloy structure with an intrinsic layer between two n-doped layers, depositing an opaque metal layer over the semiconductor layers and etching the top metal layer and semiconductor layers to form continuous address lines with underlying semiconductor layers and a bidirectional threshold element connected between each electrode and an adjacent overlying address line. A metal pad positioned on each electrode provides for improved conductivity with each adjacent threshold element. The threshold elements have a threshold settable by directing light through each pad, provided the pads are at least partly transmissive. A symmetrical bilateral threshold element is formed of first and second series coupled threshold elements.

16 Claims, 11 Drawing Figures

PROGRAMMABLE SEMICONDUCTOR SWITCH FOR A LIGHT INFLUENCING DISPLAY AND METHOD FOR MAKING SAME

RELATED APPLICATION

This application is a continuation-in-part of copending application Ser. No. 603,852, filed Apr. 25, 1984 for "Programmable Semiconductor Switch For A Display Matrix Or The Like And Method For Making Same", now U.S. Pat. No. 4,667,189, May 19, 1987.

FIELD OF THE INVENTION

The present invention broadly relates to a semiconductor switch having a programmable threshold voltage as well as a display having a matrix array of addressable pixels which are electrically isolated by programmable semiconductor switches. The invention also embraces methods for making the programmable switch.

BACKGROUND OF THE INVENTION

Nonlinear semiconductor switches such as diodes are employed in various electronic control applications where it is necessary to switch current flow in response to a prescribed level of voltage. One such application involves visual display devices which employ a matrix of electrically energizable pixels (picture elements). The pixels may consist, for example, of well known liquid crystal elements in which a film or cell of liquid crystal material is positioned between a pair of electrodes. Conventional nematic type liquid crystals, which are commonly used in displays, consist of elongate molecules whose longitudinal axes can be rotated when an electric field or prescribed magnitude is applied to the material. The molecular rotation rotates the polarization of light transmitted through the liquid crystal material.

One common type of liquid crystal display employs twisted nematic crystals sandwiched between a pair of parallel glass sheets and a pair of polarizers respectively on opposite sides of the glass sheets. The polarizer on the input side of the display allows ambient light polarized in only one direction to pass into the display. The glass sheets have parallel lines formed by etching or the like on the opposing faces thereof. The molecules of the nematic crystal material near the surface of each glass plate tend to align their long axes parallel to the lines on the glass plates. The plates are oriented relative to each other such that the two sets of lines are nonparallel, e.g. 90 degrees off axis, thus giving the nematic crystals a helical or twisted orientation. Polarized light passing through the cell is rotated by the crystals. The second polarizer can thus allow the passage of the rotated light out of the cell. Application of an electric field across the cell rotates or "untwists" the molecules so that their axes extend substantially parallel to each other, thus blocking passage of light through the cell and the polarizers.

In order to display changeable data using liquid crystal displays, the pixels are arranged into M rows and N columns defining a matrix array that is addressed using conventional "X-Y" addressing techniques which employ M+N address lines. Each pixel possesses a unique X-Y location in the matrix which may be addressed by a corresponding combination of X and Y addressing lines.

Select voltages are subsequently applied to all rows of the matrix while the data voltages are applied to the columns. After scanning all lines in the display the polarity of the pixel voltages is reversed for the next scan. This prevents a DC component of voltage from being applied to the liquid crystal material which leads to degradation of the material. The liquid crystal pixel responds to the RMS voltage applied across its electrodes and the material, e.g. a threshold between $V_{RMS}=1.1$ volts and $V_{RMS}=1.9$ volts.

Direct multiplexing of a matrix type liquid crystal display is possible for only a limited number of rows (on the order of 10 rows) due to this poorly defined threshold, e.g. 90% transmissivity at $V_{RMS}=1.1$ V; 10% transmissivity at $V_{RMS}=1.9$ V. To increase the number of possible rows in a display, without losing overall display quality, a threshold device must be incorporated into each liquid crystal picture element.

The use of conventional diodes as isolating devices for pixel addressing has been less than completely satisfactory for several reasons. First, it is not always possible to control or select the threshold voltage at which the diode commences to conduct current when forward biased. Additionally, variations may exist in the threshold voltage of the diodes used in a single matrix. For a given level of address signal voltage, some of the forward biased diodes may conduct while others having a higher threshold voltage may not conduct or may conduct at a different rate. Accordingly, it is necessary to assure that a relatively high level address signal is applied to address the pixels.

It is also desirable to minimize the rise time of the current applied to each pixel in order to quickly switch the pixel after it has been addressed. The current-voltage characteristics of diodes previously employed for pixel isolation are such that the rise time of the current conducted by the diode following the application of threshold voltage is slower than desired.

Thin film field-effect transistors have also been used as isolation devices in liquid crystal pixel elements. Transistors have a more complex structure than do diodes however and are three terminal devices which complicate pixel manufacture.

SUMMARY OF THE INVENTION

In accordance with the present invention a method and apparatus are disclosed for forming a light influencing display. The method includes the steps of forming a plurality of spaced apart, transparent conductive electrodes on a transparent insulative substrate, depositing a plurality of amorphous semiconductor alloy layers over the electrodes and substrate, depositing a metal layer overlying the top amorphous silicon alloy layer, and using a mask to selectively etch away the deposited multilayer structure to form a plurality of multilayer address lines with a threshold element in contact with each electrode. One embodiment of the present invention also provides for setting the threshold of each such element by directing radiation through the substrate and into each threshold device.

The present invention also provides for a bidirectional threshold element formed of deposited semiconductor materials having a selected thickness as well as a selected area. The selected area is on the order of 900 square microns. Opaque metal conductors formed at each end of the device optically insulate the device from spurious incident light. In accordance with another embodiment of the invention the threshold device can be incorporated into a subassembly for a light influencing display.

In yet another embodiment of the present invention, an improvement for a subassembly usable in a light influencing display includes first and second bidirectional threshold elements coupled between a display electrode and an adjacent address line. The threshold elements can be series or parallel coupled to provide a bidirectional, symmetrical threshold device. The bidirectional threshold element can be formed of multiple layers of semiconductor material.

In yet another embodiment of the invention a subassembly usable in a light influencing display is provided. The subassembly includes a substrate, an electrode formed thereon, an adjacent address line and a bidirectional, deposited semiconductor means for forming a threshold coupled between the electrode and the address line. The threshold means can include first and second threshold elements that may be parallel or series coupled. In an alternate embodiment of the invention, one of the threshold elements can be formed partly overlying the address line.

DETAILED DESCRIPTION OF THE PREFERRED EMBODIMENTS

Figure 1:
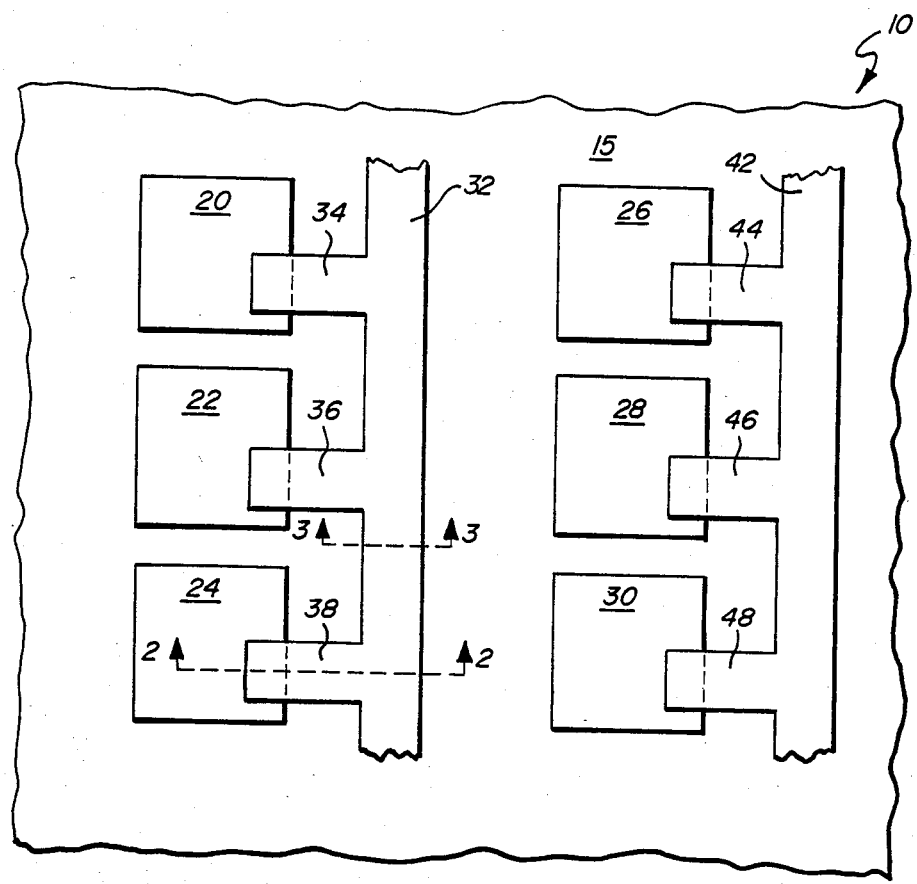
FIG. 1 is a fragmentary top planar view of a subassembly for a light influencing display structure in accordance with the present invention.

With respect to the figures, FIG. 1 illustrates a top planar view of a portion of a subassembly 10 usable in a light influencing display in accordance with the present invention. The subassembly 10 includes a substrate 15 which may be glass or some other substantially transparent insulator. Formed on the substrate 15 are a plurality of spaced apart electrodes 20 through 30. Each of the electrodes 20 through 30 forms a portion of a pixel in an assembled light influencing display. The electrodes 20 through 30 are formed preferably of a transparent conductor such as indium tin oxide. Each of the electrodes 20 through 24 is coupled to an address bus 32 by a respective connector element 34 through 38. A second address bus 42 spaced apart from the first address bus 32, essentially parallel thereto, is also formed on the substrate 15. Each of the electrodes 26 through 30 is coupled to the address line 42 by a connector element 44 through 48.

Figure 2:
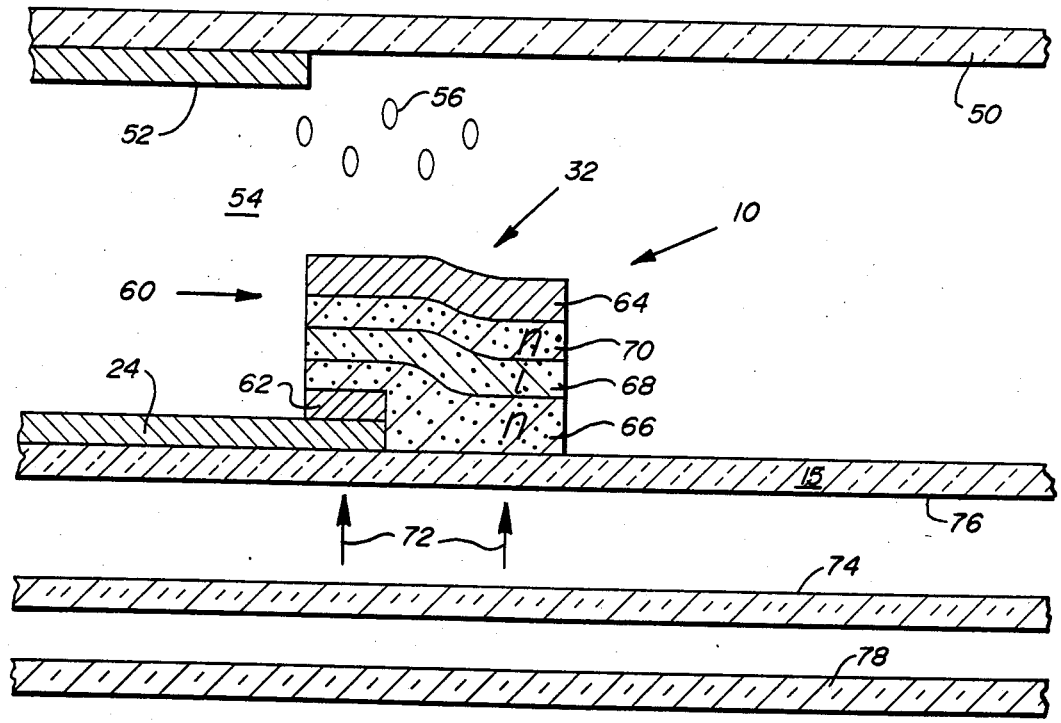
FIG. 2 is an enlarged, fragmentary, sectional view taken along line 2—2 of FIG. 1.

FIG. 2 is an enlarged sectional view incorporating the subassembly 10 and taken along the line 2—2 of FIG. 1. The subassembly 10 has been combined with the spaced apart substrate 50 upon which is formed a second indium tin oxide electrode 52. The spaced apart electrodes 24 and 52 form the control electrodes for a pixel of a light influencing display. A region 54 between the electrodes 24 and 52 is filled with a light influencing material 56. By the term "light influencing material" is meant any material which emits light or can be used to selectively vary the intensity, phase, or polarization of light either being reflected from or transmitted through the material. Liquid crystal material is only one such material having these characteristics. The light influencing material 56 can be of any conventional variety, as for example, nematic liquid crystal display material.

Light influencing displays of the type disclosed in FIG. 2 were previously disclosed in U.S. patent application Ser. No. 603,852, filed Apr. 25, 1984 and entitled "Programmable Semiconductor Switch For A Display Matrix Or The Like And Method For Making Same." The disclosure of said patent application is hereby incorporated herein by reference. As is more fully discussed in said patent application it is desirable to incorporate with each light influencing pixel element a nonlinear threshold element for purposes of increasing the number of possible lines in the display. One such threshold element, also disclosed in said patent application, is a two terminal bidirectional n—i—n or n+in+ threshold element having three layers formable from deposited amorphous semiconductor alloy as discussed further herein.

It will be understood that the electrodes 24 and 52, as well as the underlying substrates 15 and 50, are treated as is conventional to align the molecules of the display material 56. This treatment can include, for example, applying an alignment coating over the electrodes 24 and 52.

The fragmentary sectional view of the subassembly 10 of FIG. 2 includes an n—i—n threshold element 60 of the type disclosed in said patent application. A pad of deposited chromium 62 partly overlies the electrode 24 between the electrode 24 and the element 60.

The threshold element 60 is formed between the metal pad 62, such as chromium, and a second deposited metal layer 64, such as chromium or an alloy of molybdenum and tantalum. As can be seen from FIG. 2, the metal pad 62 interconnects the pixel electrode 24 with a lower n-doped layer 66 of the threshold device 60. A substantially intrinsic layer 68 is positioned between the n-doped layer 66 and an upper n-doped layer 70. The top metal layer 64 is deposited to a thickness on the order of 1000 angstroms. The upper metal layer 64 is thick enough so as to be opaque to incident visible light. The metal layer 64 blocks and isolates the n—i—n threshold element 60 from any incident light or radiation which might pass through the substrate 50 and also functions as a highly conductive region or part of the address line 32.

The chromium pad 62 can be formed thick enough so as to be opaque to visible light. Alternately, as another embodiment, the pad 62 can be formed so as to be partly transmissive to light. The portion of the n—i—n device 60 vertically disposed between the metal pad 62 and the metal layer 64 is operative to provide the requisite threshold for the electrode 24.

Figure 3:
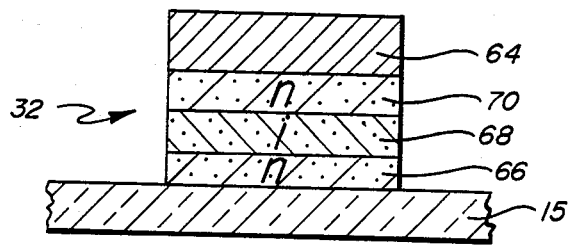
FIG. 3 is an enlarged, fragmentary, sectional view taken along line 3—3 of FIG. 1.

As can be seen from the sectional view in FIG. 3, taken along line 3—3 of FIG. 1, the address line 32 is formed as a continuous multilayer structure including the deposited amorphous semiconductor alloy layers 66 through 70 along with the overlying top metal layer 64. Again with reference to FIG. 2, as is known from the specification of said incorporated patent application, the threshold of the element 60 can be adjusted to a predetermined value by incident radiation such as visible light. For programming purposes, radiation 72 from a selected source can be directed against the transparent substrate 15. The radiation 72 passes through the substrate 15 and also through the chromium layer 62. The chromium layer 62 in this embodiment is deposited to a thickness on the order of 50 to 100 angstroms so as to be 10% transmissive. The radiation 72 can be visible light, preferably red light with a wavelength on the order of 600 nm for more effective penetration of the element 60.

Subsequent to the threshold having been set in the element 60 by the incident radiation 72, a polarizer 74 is applied to an outer surface 76 of the substrate 15. A mirror 78 is applied over the polarizer 74 completing the subassembly 10. The subassembly 10 can then be combined with the second substrate 50 carrying the electrode 52 and light influencing material 56 to form a completed display pixel.

Figure 4:
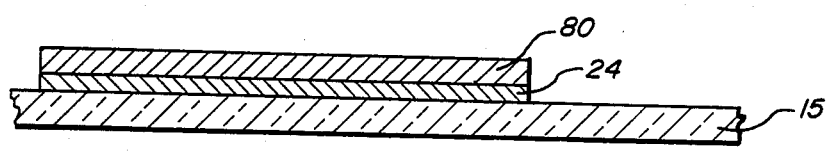
FIG. 4 is an enlarged fragmentary sectional view illustrating a step of the method embodying the present invention.

FIG. 4 illustrates a step of a method embodying the present invention. With reference to FIG. 4, a layer of indium tin oxide is first deposited on the substrate 15. Over the indium tin oxide layer, a layer of chromium is deposited. By use of a photolithographic mask and etching the excess indium tin oxide and chromium may be removed forming electrodes, such as the electrode 24, with an overlying layer of chromium 80. The metal layer 80 in combination with the electrode 24 form a two-layer conductor having a selected size and shape. As noted above, the thickness of the chromium layer can be on the order of 50 to 100 angstroms so that it is approximately 10% transmissive.

Figure 5:
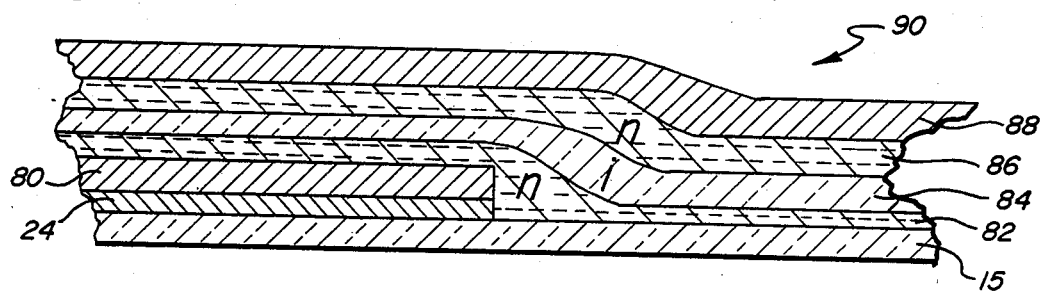
FIG. 5 is an enlarged fragmentary sectional view illustrating another step of the method.

In the next step of the present method, illustrated in FIG. 5, a continuous layer 82 of n-type semiconductor material is deposited over the substrate 15, and the chromium pads such as the pad 80. For purposes of forming a plurality of n—i—n bidirectional threshold elements such as the element 60, the layer 82 is deposited with n-type doping. A layer of intrinsic semiconductor material 84 is then deposited overlying the n-type layer 82. A second n-type layer 86 of semiconductor material is deposited overlying the intrinsic layer 84. A top layer 88 of metal, such as chromium or a molybdenum-tantalum alloy, is deposited over the second n-type layer 86. The layers 82 through 88 form a multilayer structure 90 which can be processed further.

The layers 82 through 86 are preferably formed from deposited semiconductor material. The deposited semiconductor material is preferably an amorphous semiconductor alloy including silicon. The amorphous silicon alloy can also include hydrogen and/or fluorine and can be formed by, for example, plasma-assisted chemical vapor deposition, i.e. glow discharge as disclosed, for example, in U.S. Pat. No. 4,226,898 to S. R. Ovshinsky et al. for "Amorphous Semiconductors Prepared By Glow Discharge Process," the disclosure of which patent is incorporated herein by reference. By the term "amorphous" is meant an alloy or material which has long-range disorder, although it may have short- or intermediate-range order or even contain at times some crystalline inclusions.

The layers 82 through 86 can be deposited in a continuously maintained partial vacuum. The glow discharge decomposition of at least silane gas ($SiH_4$) and/or silicon tetrafluoride ($SiF_4$) gas may be used to deposit the layers 82–86. The metal layer 88 may be deposited using any known conventional deposition method such as standard methods of vacuum deposition.

Figure 6:
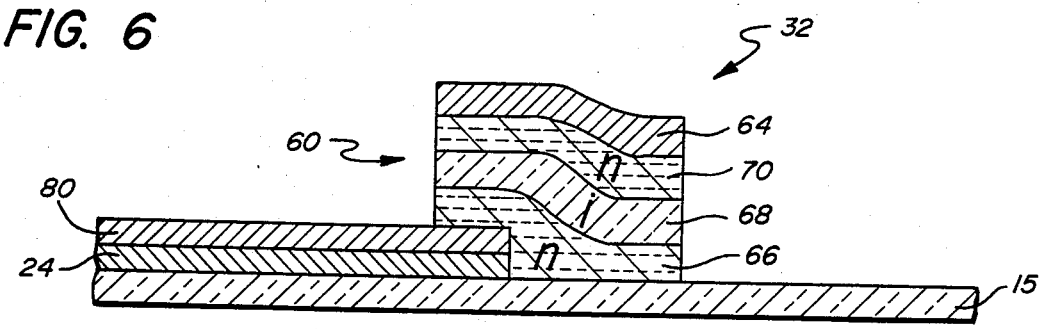
FIG. 6 is an enlarged fragmentary sectional view in section illustrating another step of the method.

In the next step of the present method as illustrated in FIG. 6, the multilayer structure 90 is patterned using photolithography and a mask to form the address lines 32 and 42 as well as the respective threshold elements such as the element 60. A plasma etch may be used to etch away the unwanted portions of the multilayer structure 90. During the etching process the metal layer 88, which is patterned to form the upper layer 64 of the address line such as 32 protects the underlying n—i—n layers from being etched away.

Subsequent to etching of the multilayer structure 90 as illustrated in FIG. 6 and while the protective photoresist is still present, the metal layer 80 is etched away forming the pad 62 and exposing the electrode 24 as illustrated in FIG. 2. In a subsequent step, as discussed above, the threshold elements, for example element 60, of the subassembly 10 can then be optically programmed.

The method as illustrated by the steps of FIGS. 4, 5, 6 and the sectional views of FIGS. 2 and 3 has only two steps of patterning and etching. This is due to the fact that the n—i—n layers 66 through 70 extend continuously between the electrodes, such as the electrodes 22 and 24, as best shown in FIG. 2. The subassembly 10 formed by the present method thus has continuously extending multilayer address lines, such as the lines 32 and 42. Thus, the present method is simple and has fewer steps than would be the case if discrete threshold devices were formed.

Figure 7:
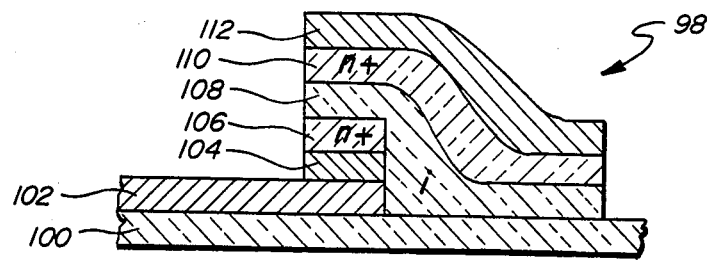
FIG. 7 is an enlarged fragmentary sectional view of another embodiment of the present invention.

A further embodiment of the invention is illustrated in FIG. 7. In the embodiment of FIG. 7 a subassembly 98 for a light influencing display is formed with a glass substrate 100. The substrate 100 has formed thereon a pixel electrode 102. The pixel electrode 102 is formed, for example, of a transparent conductive material such as indium tin oxide. Formed on a portion of the electrode 102 is a layer of chromium 104. Overlying the layer of chromium is a layer of n-type semiconductor material 106. Unlike the embodiment of FIG. 2 wherein the n-type semiconductor layer 66 not only extends over the chromium metal layer 62 but also extends over a portion of the substrate 15, in the embodiment of FIG. 7, the n-doped layer 106 is restricted to overlie the chromium layer 104.

A layer of intrinsic semiconductor material 108 overlies the n-type layer 106 and a portion of the substrated 100. A second n-type semiconductor layer 110 overlies the intrinsic semiconductor layer 108. A metal layer 112 of chromium or a molybdenum-tantalum alloy overlies the doped semiconductor layer 110. The layer 112 can function as an address line analogous to the layer 64 of FIG. 2.

In the embodiment of FIG. 7 the n—i—n isolation device, formed of layers 106 through 110 is vertically arrayed with respect to the substrate 100 and is electrically coupled between between the chromium layer 104 and the address line 112. The layers of semiconductor material 106, 108 and 110 of the subassembly 98 can be formed of amorphous semiconductor alloys of the type previously disclosed herein. The embodiment of FIG. 7 has the further advantage that by limiting the area of the n-type layer 106, leakage current due to edge effects is reduced.

Figure 8:
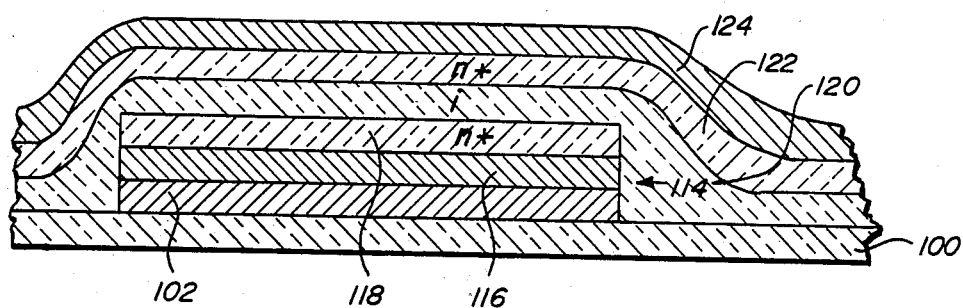
FIG. 8 is an enlarged fragmentary sectional view illustrating a method of fabricating the embodiment of FIG. 7.

FIG. 8 illustrates part of a method of making the subassembly 98 of FIG. 7. A layer of indium tin oxide is first applied over an upper surface of the substrate 100. A layer of chromium is then formed by vacuum deposition of a conventional variety overlying the layer of indium tin oxide. A first layer of n-type semiconductor material is then deposited overlying the layer of chromium.

The layers of indium tin oxide, chromium and n-type semiconductor material are patterned so as to form a multilayer structure 114, as illustrated in FIG. 8. The structure 114 has a bottom layer formed of the shaped indium tin oxide electrode 102, a chromium layer 116 overlying the indium tin oxide layer and an n-type semiconductor layer 118 overlying the chromium layer 116.

The layers 102 and 116 form a multilayer conductor having an adjacent overlying layer of semiconductor material 118. In the next step of fabricating the subassembly 98, a continuous layer 120 of intrinsic semiconductor material is then deposited over the doped semiconductor layer 118 and the exposed regions of the substrate 100. A second n-type doped semiconductor layer 122 is then deposited overlying the intrinsic layer 120. Finally, a continuous metal layer 124 is deposited overlying the second doped semiconductor layer 120. The layers 120 and 122 may be deposited using the glow discharge deposition technique in a continuously maintained partial vacuum as previously discussed.

In a subsequent step the layers 120, 122 and 124 are etched using a layer of protective photoresist so as to form the layers 108 through 112 of FIG. 7. Before the layer of protective resist is removed, the n+ type semiconductor layer 118 and the chromium layer 116 of FIG. 8 are etched so as to form the layers 106 and 104 respectively of FIG. 7.

Figure 9:
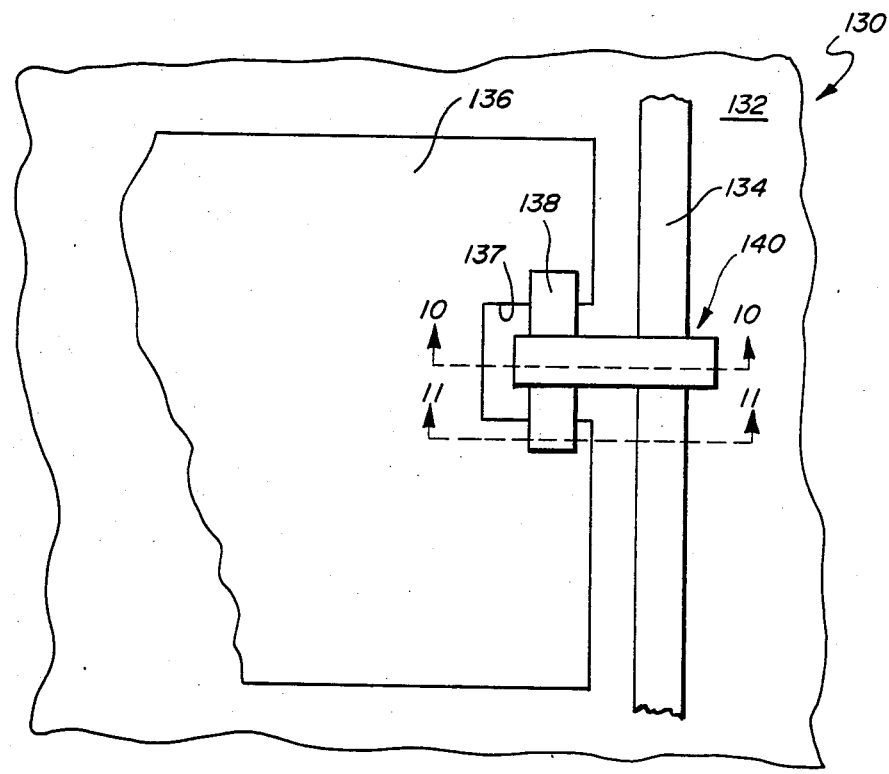
FIG. 9 is a fragmentary top planar view of an alternate embodiment of a subassembly for a light influencing display in accordance with the present invention.

Yet a further embodiment of the present invention is illustrated in FIG. 9. It has been observed that the n—i—n devices of the present application, as well as those of the parent patent application hereto, from time to time demonstrate nonsymmetries with respect to their threshold characteristics. These nonsymmetries are believed to be in part created or caused by the fabrication process. From the point of view of incorporating such n—i—n devices as bidirectional threshold elements for use with liquid crystal display pixels these nonsymmetries may present a problem. The basis of the problem lies in the fact that the nonsymmetrical characteristic results in an average DC signal being applied to the liquid crystal display, in a given direction, over a period of time. It is known that such DC potentials applied to liquid crystal display pixels will result in degradation of the liquid crystal display material. Hence, such DC potentials are to be avoided if at all possible. Additionally, the nonsymmetries complicate the design of the addressing circuitry and are undesirable for that reason also.

With respect to FIG. 9, a subassembly 130 for a light influencing display pixel is illustrated which overcomes the asymmetries found in individual n—i—n devices. The subassembly 130 is formed on a glass substrate 132 and includes an address bus 134 which is formed adjacent to a transparent conducting electrode 136. The electrode 136 conventionally can be formed of indium tin oxide. The electrode 136 is treated in a conventional manner so as to provide for the proper alignment of the liquid display material.

The electrode 136 includes a cut-out region 137. The cut-out region 137 could be eliminated without departing from the spirit and scope of the present invention. As discussed subsequently, the cut-out region 137 provides an advantage in the overall structure of the subassembly 130.

A rectangular metal pad 138 is formed overlying the cut-out region 137 of the electrode 136. The pad 138 can be formed, for example, of vacuum deposited chromium. As can be seen from FIG. 9, ends of the pad 138 overlap the electrode 136. A multilayer structure 140 interconnects the address bus 134 with the metal pad 138. The multilayer structure 140 includes two series coupled n—i—n devices. The n—i—n devices are series coupled in reverse fashion such that the asymmetrical characteristics are additive in reverse order and cancel each other out. This results in a symmetrical, bidirectional, nonlinear characteristic between the address line 134 and the metal pad 138.

Figure 10:
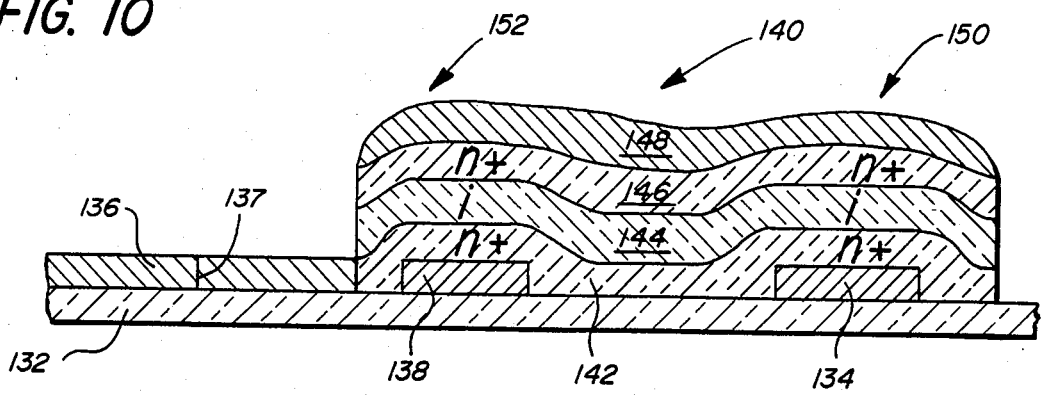
FIG. 10 is an enlarged fragmentary sectional view taken along line 10—10 of FIG. 9.

FIG. 10 is a sectional view taken along line 10—10 of FIG. 9 and illustrates the structure of the element 140. As illustrated in FIG. 10, the address lead 134 is shown in section positioned on the substrate 132. Spaced over from the address lead 134 is a portion of the metal pad 138 also formed on the substrate 132. Overlying the address line 134 and the metal pad 138 is the multilayer structure 140.

The structure 140 includes a first layer of doped semiconductor material 142. The layer 142 is doped with n-type doping. Overlying the layer 142 is a layer of deposited intrinsic semiconductor material 144. Overlying the layer 144 is a second doped layer of semiconductor material 146. The layer 146 is doped with n-type doping. Overlying the second doped layer of semiconductor material 146 is a deposited layer of metal 148. The layer of metal 148 may be vacuum deposited and may be formed of chromium or an alloy of molybdenum-tantalum.

A first n—i—n device 150 is formed in the element 140 vertically arrayed with respect to the address bus 134 and coupled between the address bus 134 and the metal layer 148. A second n—i—n device 152 is formed vertically arrayed above the metal pad 138 coupled between the metal pad 138 and the metal layer 148. The two n—i—n devices 150 and 152 are series coupled by the metal layer 148.

Alternately, the n—i—n devices 150 and 152 could be formed in parallel coupled between the address line 134 and the electrode 136. Formation of the device 152 over the cut-out 137 results in a well defined operative cross section thereto.

Application of a suitable driving voltage to the address line 134 will result in that potential being transmitted through the two series connected n—i—n devices 150 and 152 through the metal layer 138 to the indium tin oxide electrode 136.

Figure 11:
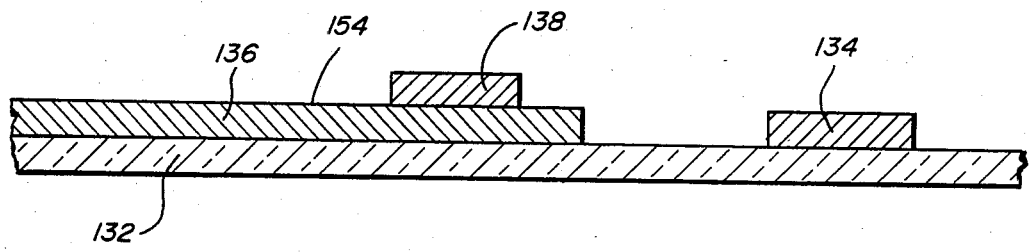
FIG. 11 is an enlarged fragmentary sectional view taken along line 11—11 of FIG. 9.

FIG. 11 is a sectional view taken along line 11—11 of FIG. 9 and illustrates further the relationship between the metal address bus 134 and the spaced apart metal pad 138. As can be seen from FIG. 11, the metal pad 138 positioned in part on an upper surface 154 of the indium tin oxide electrode 136 whereas the address bus 134 is positioned on the substrate 132.

In addition to the embodiment set forth above, the broader aspects of the invention also include the use of n+in+ threshold elements, p—i—p threshold elements as well as alternate selected metals and also the use of amorphous germanium semiconductor alloys.

We claim:

1. A pixel for a display comprising:
an insulative substrate;
a pixel electrode formed on said substrate;
threshold means for isolation coupled to said electrode;
and a multilayer radiation blocking address line overlying said threshold means with said threshold means including means responsive to optical radiation for programming a threshold voltage at which said threshold means conducts current between said address line and said pixel electrode.

2. A pixel as defined in claim 1 wherein said substrate is transparent and said threshold means includes a surface at least partly transmissive to incident radiation with said threshold settable in response to radiant energy directed through said substrate and into said threshold means.

3. A pixel as defined in claim 1 wherein said multilayer address line extends continuously between at least said pixel electrode and a second, spaced apart pixel electrode.

4. A pixel as defined in claim 3 wherein said address line includes at least a first layer formed of semiconductor material and a second overlying layer formed of a metal.

5. A pixel as defined in claim 4 wherein said threshold element is formed from semiconductor material.

6. A pixel as defined in claim 5 wherein said semiconductor material is deposited semiconductor material.

7. A pixel as defined in claim 6 wherein said deposited semiconductor material is an amorphous semiconductor alloy.

8. A pixel as defined in claim 7 wherein said amorphous semiconductor alloy includes silicon.

9. A pixel as defined in claim 8 wherein said amorphous silicon alloy includes hydrogen.

10. A pixel as defined in claim 8 wherein said amorphous silicon alloy includes fluorine.

11. A pixel as defined in claim 7 wherein said electrode is formed from a transparent conductive material.

12. A pixel as defined in claim 11 wherein said transparent conductive material is indium tin oxide.

13. A pixel as in claim 1, wherein said threshold means includes first and second bidirectional means for forming a threshold, said first and second means coupled between said pixel electrode and said address line, whereby said threshold means is bidirectional.

14. A pixel as in claim 13, wherein said first and second means are coupled in series.

15. A pixel as in claim 13, wherein said first and second threshold means are formed of multilayer semiconductor material.

16. A pixel as in claim 15, wherein said first and second threshold means are each formed of a first doped layer of semiconductor material, an overlying layer of intrinsic semiconductor material and a second doped layer of semiconductor material.

* * * * *